US012791887B2

(12) United States Patent
Dupont et al.

(10) Patent No.: US 12,791,887 B2
(45) Date of Patent: Nov. 10, 2026

(54) ELECTROOPTICAL DEVICE AND METHOD FOR PRODUCING AN ELECTROOPTICAL DEVICE

(71) Applicant: COMMISSARIAT A L'ENERGIE ATOMIQUE ET AUX ENERGIES ALTERNATIVES, Paris (FR)

(72) Inventors: Florian Dupont, Grenoble Cedex (FR); Yohan Desieres, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 331 days.

(21) Appl. No.: 18/731,510

(22) Filed: Jun. 3, 2024

(65) Prior Publication Data

US 2024/0411158 A1 Dec. 12, 2024

(30) Foreign Application Priority Data

Jun. 7, 2023 (FR) ...................................... 2305745

(51) Int. Cl.
*G02F 1/035* (2006.01)
*H10P 14/60* (2026.01)

(52) U.S. Cl.
CPC .......... *G02F 1/035* (2013.01); *H10P 14/6329* (2026.01)

(58) Field of Classification Search
CPC ...... G02F 1/035; G02F 1/0353; G02F 1/0356; G02F 1/225; G02F 2201/063; G02B 2006/1204; G02B 2006/12142; G02B 2006/12097
USPC ........................................................ 385/1-3
See application file for complete search history.

(56) References Cited

U.S. PATENT DOCUMENTS

| | | | | |
|---|---|---|---|---|
| 6,545,791 | B1 * | 4/2003 | McCaughan | G02F 1/2255 359/321 |
| 2017/0141750 | A1 * | 5/2017 | Pelzel | H03H 1/0007 |
| 2021/0399712 | A1 * | 12/2021 | Daimon | H03H 9/02574 |
| 2022/0107518 | A1 * | 4/2022 | Liang | G02F 1/035 |
| 2022/0373828 | A1 * | 11/2022 | Yoshida | G02F 1/0316 |
| 2023/0179165 | A1 * | 6/2023 | Dupont | H03H 9/02834 |
| 2023/0216474 | A1 * | 7/2023 | Dupont | H03H 3/02 333/186 |
| 2023/0296929 | A1 * | 9/2023 | Hara | G02F 1/2255 385/2 |

(Continued)

OTHER PUBLICATIONS

"Toward High-Quality Epitaxial LiNbO3 and LiTaO3 Thin Films for Acoustic and Optical Applications" by Bartasyte et al., Adv. Mater. Interfaces, 4, 1600998 (Year: 2017).*

(Continued)

*Primary Examiner* — Robert Tavlykaev
(74) *Attorney, Agent, or Firm* — Oblon, McClelland, Maier & Neustadt, L.L.P.

(57) ABSTRACT

A device including, stacked in a vertical direction (z), a silicon-based substrate, a nucleation layer made of a nitride-based refractory material, a lithium niobate-based layer portion, called LNO portion, made of mesa on the nucleation layer, the LNO portion being bordered by a masking layer. The device further includes at least one electrode configured to apply an electric field to the LNO portion. A method for producing such a device, including a formation by localised epitaxy of the LNO portion, is also disclosed.

15 Claims, 8 Drawing Sheets

A-A

(56) References Cited

U.S. PATENT DOCUMENTS

2023/0400716 A1* 12/2023 Meade .................. G02F 1/0018

OTHER PUBLICATIONS

Preliminary French Search Report issued Mar. 27, 2024 in French Application 2305745 filed on Jun. 7, 2023, 10 pages (with English Translation of Categories of Cited Documents & Written Opinion).
Guo et al., "Polarity control and fabrication of lateral polarity structures of III-nitride thin films and devices: progress and prospects", Journal of Physics D: Applied Physics, 2020, 24 pages.
Spreitzer et al., "Epitaxial ferroelectric oxides on silicon with perspectives for future device applications", APL Materials, 2021, 13 pages.
Barrientos et al., "Leas-Free $LiNbO_3$ Thick Film MEMS Kinetic Cantilever Beam Sensor/Energy Harvester", Sensors, 2022, 12 pages.
Suraj et al., "Polarization Independent Grating in Ga—N-on-Sapphire Photonic Integrated Circuit", arxiv.org, 2023, 12 pages.
Bartasyte et al., "Material strategies to enhance the performance of piezoelectric energy harvesters based on lead-fee materials", Journal of Micromechanics and Microengineering, vol. 33, 2023, 38 pages.
Ahmed et al., "Subvolt electro-optical modulator on thin-film lithium niobate and silicon nitride hybrid platform", Optics Letters, vol. 45, No. 5, 2020, 4 pages.
He et al., "High-Performance Hybrid Silicon and Lithium Niobate Mach-Zehnder Modulators for 100 Gbit/s and Beyond", Nature Photonics, 2019, 21 pages.

* cited by examiner

ELECTROOPTICAL DEVICE AND METHOD FOR PRODUCING AN ELECTROOPTICAL DEVICE

TECHNICAL FIELD

The present invention generally relates to an electrooptical component and a method for producing the layer based on a Pockels effect material forming the core of this component. The invention more specifically relates to producing optical phase modulators.

PRIOR ART

These phase modulators can advantageously be used in "optical phased array" (OPA)-type circuits, for example for designing laser remote detection systems, called LIDAR (laser imaging detection and ranging) systems.

The principle of optical phase modulators is typically based on a local modulation of the refraction index of the material, wherein the light wave propagates. This refraction index variation can be advantageously obtained by Pockels effect, for certain crystalline materials without symmetry with respect to an axis.

It is, in particular, the case of lithium niobate (LiNbO3) and of tantalum niobate (LiTaO3). Their intrinsic properties make it possible, in particular, to consider producing modulators operating at a high frequency, with low optical losses (typically around a few decibels for a TT phase shift), and with a low energy consumption. However, the thin layer synthesis of these materials is complex and the requirements linked to their crystalline quality are high. The thin LiNbO3 or LiTaO3 layer must, in particular, have a high crystalline quality and a controlled stoichiometry. It must also have a controlled crystalline orientation, according to the architecture and the position of the electrodes of the electrooptical component to be produced. Below, only LiNbO3 is mentioned, for example, for brevity. The properties of LiTaO3 and of an Li(Nb,Ta)O3 alloy are very close to the properties of LiNbO3. It is understood that LiTaO3 or Li(Nb,Ta)O3 can be directly substituted for LiNbO3.

Solutions making it possible to synthesise LiNbO3 in thin layers on a sapphire substrate have been developed. This type of substrate is expensive and the applications linked to these solutions remain limited. Producing thin LiNbO3 layers on a silicon-based substrate presents a considerable challenge. This would make it possible to consider a new generation of multifunctional systems comprising electrooptical, acoustic, microelectronic and/or quantum devices cointegrated on one same substrate. A solution consists of transferring a thin LiNbO3 layer from a donor substrate, typically from a monocrystalline LiNbO3 substrate, to a receiver substrate, typically a silicon substrate with a superficial oxide layer. This solution implementing numerous technical steps has a significant cost. The achievable range of thin layer thicknesses, typically greater than 200 nm and less than 1 μm, is also limited by the transfer and thinning technical stresses. The thickness homogeneity of a thin layer obtained by transfer is generally not sufficient for the targeted applications. The thickness standard deviation of a thin LiNbO3 layer of 200 nm obtained by transfer reaches typically around 50 nm. This type of transfer is further done "solid plate", over the entire surface of the receiver substrate. It is thus necessary to etch the LiNbO3 layer transferred to obtain LiNbO3 layer portions locally on the receiver substrate. The etching of LiNbO3 is complex to control, in particular, to obtain roughnesses which are compatible with optical applications. Problems of contaminating production lines with lithium can occur during etching. During the solid plate transfer, it is also necessary to manage the mechanical stresses linked to the thermal dilatation difference between silicon and LiNbO3. The formation of localised LiNbO3 portions on the receiver substrate is therefore difficult and expensive.

There is therefore a need consisting of locally producing a lithium niobate-based layer on a silicon-based substrate, which has a crystalline quality which is compatible with the targeted applications, while limiting the production costs.

An aim of the present invention is to at least partially meet this need.

In particular, an aim of the present invention is to propose a method for the localised formation of an on-silicon substrate lithium niobate layer portion, which has an optimised cost and/or compatibility with respect to current methods. Such a method is advantageously implemented to produce a device comprising a lithium niobate layer portion.

Another aim of the present invention is to propose a device, typically a phase modulator-type electrooptical device, comprising a lithium niobate layer portion.

Other aims, features and advantages of the present invention will appear upon examining the description below and accompanying drawings. It is understood that other advantages can be incorporated.

SUMMARY

To achieve this aim, according to an embodiment, a method for producing a device is provided, comprising a lithium niobate or lithium tantalate layer portion, said method comprising the following steps:

- Providing a silicon-based substrate,
- Forming a nucleation layer made of a nitride-based refractory material on the substrate,
- Forming a masking layer on the nucleation layer, comprising at least one opening exposing a part of the nucleation layer,
- Forming, by epitaxy, a lithium niobate- or lithium tantalate-based layer portion, called LNO portion, made of mesa on the exposed part of the nucleation layer, in the at least one opening,
- Preferably forming two electrodes configured to apply an electric field to the LNO portion.

In the scope of the development of the present invention, specifications for the nucleation layer has been established. The nucleation layer must preferably have the following properties:

- Having a crystalline structure and/or a mesh parameter which is compatible with a silicon-based substrate. This makes it possible, in particular, to epitaxially grow the nucleation layer on the substrate.
- Having a crystalline structure and/or a mesh parameter close to or compatible with lithium niobate. This makes it possible to epitaxially grow the LNO portion on the nucleation layer.
- Preferably having a thermal dilatation coefficient close to lithium niobate. This makes it possible to limit the appearance of cracks due to temperature variations during the formation of the LNO portion.
- Being able to block the diffusion of Li atoms, in particular in Si or SiO2. This makes it possible to avoid a loss of stoichiometry of the LNO portion.

A technical bias of the prior art is that such a nucleation layer must necessarily be oxide-based, in order to avoid a loss of stoichiometry of the LNO portion due to a diffusion of oxygen from the LNO portion to the nucleation layer.

On the contrary, to meet these specifications, the nucleation layer is chosen according to the present invention made of a nitride-based refractory material. This nucleation layer made of a nitride-based refractory material is called refractory nitride-based nucleation layer below, for brevity. In the scope of the development of the present invention, it has indeed been observed that such a refractory nitride-based nucleation makes it possible, fully unexpectedly, the epitaxy of the LNO portion under good conditions. Surprisingly, it has also been observed that such a nucleation layer makes it possible to block both the diffusion of oxygen and the diffusion of lithium to the silicon-based substrate. This results that the epitaxially grown LNO portion on such a nucleation layer preserves the required stoichiometry.

Moreover, the different crystalline structures and the mesh parameters of the refractory nitrides, typically III-N nitrides, are fully compatible with those of lithium niobate and silicon. Such a nucleation layer can therefore advantageously be epitaxially grown on a silicon-based substrate, then enable the epitaxy of the LNO portion.

According to the invention, the epitaxy of LNO is done in a localised manner, in the at least one opening of the masking layer. This makes it possible to obtain only an LNO layer portion. This makes it possible to limit the mechanical stresses induced by the difference of thermal dilatation coefficients between lithium niobate and the nitride-based refractory material. The LNO portion undergoes less mechanical stresses than a lithium niobate "solid plate" layer. The crystalline quality of the LNO portion and its electrooptical properties are best preserved after the formation by epitaxy. A localised growth also makes it possible to limit the presence of lithium niobate on the entire plate. This avoids resorting to an etching of lithium niobate, which is complex to implement to obtain an LNO portion of optical quality.

The epitaxy of LNO further makes it possible to better control the thickness of the LNO portion. In particular, low thicknesses, for example, less than or equal to 200 nm, can be obtained by epitaxy with a good control of the thickness over the entire substrate. The layer transfer techniques do not make it possible to obtain such thicknesses and/or not with a sufficient precision and reproducibility over the entire substrate. The standard deviation in thickness of a thin LNO layer of 200 nm obtained by transfer can reach around 50 nm. Such a thickness variation over the entire substrate is not compatible with the optoelectronic targeted applications. On the contrary, the epitaxy of LNO makes it possible advantageously to obtain a standard deviation in thickness less than 10 nm for a layer which is 200 nm thick.

The present invention thus proposes a solution making it possible to synthesise a thin LNO layer portion directly on a silicon-based substrate—i.e. without transfer step—through the refractory nitride-based nucleation layer. Thanks to the refractory nitride-based nucleation layer, this LNO portion is stoichiometric and of high crystalline quality. Such a method can further be directly integrated in a production factory with the CMOS technology standard (based on n- and p-type complementary Metal-Oxide-Semiconductor transistors).

According to another aspect of the invention, a device is provided comprising, stacked in a vertical direction z, a silicon-based substrate, a nucleation layer on said substrate, a lithium niobate- or lithium tantalate-based layer portion, called LNO portion, made of mesa on said nucleation layer. The LNO portion is bordered by a masking layer. The device further comprises two electrodes configured to apply an electric field to the LNO portion.

Advantageously, the nucleation layer of the device is made of a nitride-based refractory material. The advantages mentioned above apply mutatis mutandis. Such a device is further directly integrable in silicon technology. It can be easily cointegrated with other microelectronic or optoelectronic or quantum devices, for example. Preferably, this device is a phase modulator-type electrooptical device. An aspect of the invention relates to a system comprising, on one same silicon-based substrate, a plurality of devices, each comprising an LNO portion according to the invention, for example, at least one electrooptical device and an electronic component such as a superconductor detector.

BRIEF DESCRIPTION OF THE FIGURES

The aims, objectives, as well as the features and advantages of the invention will emerge best from the detailed description of embodiments of the latter, which are illustrated by the following accompanying drawings, wherein.

Figure 1:
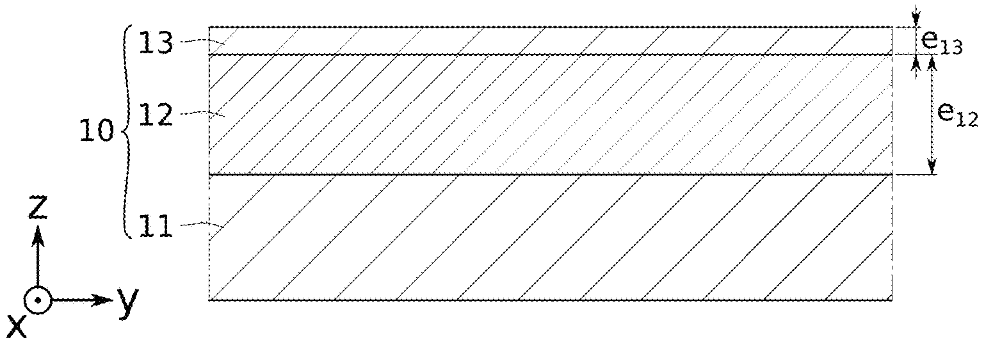
FIGS. 1 to 12 illustrate, as a cross-section, steps of a method for producing a device according to an embodiment of the present invention.

The drawings are given as examples and are not limiting of the invention. They constitute principle schematic representations intended to facilitate the understanding of the invention, and are not necessarily to the scale of practical applications. In particular, on the principle diagrams, the thicknesses of the different layers and portions, and the dimensions of patterns are not representative of reality.

DETAILED DESCRIPTION

Before starting a detailed review of embodiments of the invention, below, optional features are stated, which can optionally be used in association or alternatively:

According to an example, the LNO portion is lithium niobate LiNbO3-based. According to an example, the LNO portion is lithium tantalate LiTaO3-based. According to an example, the LNO portion is based on Li(Nb,Ta)O3 alloy.

According to an example, the nitride-based refractory material of the nucleation layer is chosen so as to have or to form:

A resistance to oxidation,

A barrier to the diffusion of lithium.

This makes it possible to avoid a diffusion of oxygen and lithium from the LNO portion to the nucleation layer. The stoichiometry of the LNO portion is thus preserved.

According to an example, the nitride-based refractory material of the nucleation layer is chosen so as to have a crystallographic structure which is compatible with the substrate and the LNO portion, such as a hexagonal structure. This makes it possible to limit the appearance of structural defects during the formation of the LNO portion by epitaxy. According to an example, the mesh parameter difference between the nitride-based refractory material and the LNO material is less than 2%. This mesh parameter difference can be taken at a sub-array of the normal cell of the LNO material. For example, in the case of $LiNbO_3$, the mesh parameter of the normal cell is 5.148 Å. In the plane (0001), it is however possible to determine a hexagonal or minicell sub-array of 3.056 Å of mesh parameter. According to an example, if the nitride-based refractory material is aluminium nitride AlN which has a mesh parameter of 3.112 Å, the mesh parameter difference between the $LiNbO_3$ minicell and the AlN is around 1.8%. The $LiNbO_3$ epitaxy can thus be done on AlN, surprisingly. To align the AlN hexagonal arrays and the $LiNbO_3$ minicell, a twist of around 30° between the $LiNbO_3$ and AlN arrays appears typically, in the plane (0001).

According to an example, the nitride-based refractory material is taken from among III-N refractory nitrides based on an element of the Ill group, such as gallium nitride GaN, aluminium nitride AlN, and AlGaN alloy.

According to an example, the substrate is silicon-based oriented in an orientation (111), the nucleation layer is aluminium nitride AlN-based, oriented in an orientation (0001), and the LNO portion is oriented in the orientation (0001).

According to an example, the LNO portion is directly in contact with the nucleation layer. In particular, there is no oxide interlayer between the nucleation layer and the LNO portion.

According to an example, the LNO portion is surmounted by an aluminium-based encapsulation portion, for example aluminium nitride AlN-based or sapphire $Al_2O_3$-based. This aluminium-based encapsulation portion typically forms, with the nucleation layer, an encapsulation of the LNO portion. This makes it possible to avoid a diffusion of oxygen and/or lithium from the LNO portion to the upper layers. The stoichiometry of the LNO portion is thus preserved. The compatibility with CMOS technologies is preserved. The electrooptical properties of the LNO portion are preserved, even improved.

According to an example, a so-called upper electrode from among the two electrodes is disposed above the LNO portion and a so-called lower electrode from among the two electrodes is disposed below the LNO portion. This device architecture is, in particular, adapted to the use of a so-called "Z-cut" oriented LNO portion (0001).

According to an example, the device is configured to form an electrooptical device, such as an optical phase modulator. In particular, the phase modulation of the light wave propagating in the device is done by Pockels effect, by applying an electric field to the LNO portion. The application of the electric field will induce a variation of the refraction index of the LNO portion, and a phase shift of the light wave.

According to an example, the LNO portion is surmounted by a silicon nitride SiN-based waveguide pattern configured to form, with the LNO portion, an edge waveguide.

According to an example, the LNO portion is surmounted by niobium nitride NbN-based structures, the device forming a superconductor detector.

According to an example, the LNO portion has a thickness e3 of between 50 nm and 500 nm, for example, of around 100 nm or 200 nm.

According to an example, the method further comprises, after epitaxy of the LNO portion, an at least partial removal of the masking layer by preserving the LNO portion formed locally in the at least one opening. This makes it possible, typically, to remove a deposition of LNO material on the masking layer, outside of the opening. This removes a possible source of contamination for other devices of the plate on which the device is produced, comprising a lithium niobate layer portion. This limits the impact of thermal dilatation coefficient differences with the silicon substrate during subsequent manufacturing steps.

According to an example, the removal is done by chemical-mechanical polishing.

According to an example, the method further comprises, after epitaxy of the LNO portion, a formation by epitaxy, on the LNO portion, of an aluminium-based encapsulation portion, for example, aluminium nitride AlN-based or sapphire- or alumina $Al_2O_3$-based.

According to an example, the method further comprises, after epitaxy of the LNO portion, a formation of a waveguide pattern configured to form, with the LNO portion, an edge waveguide. According to an example, the waveguide pattern is silicon nitride SiN-, or also $TiO_2$-, $ZrO_2$-, $Ta_2O_5$-based.

According to an example, the formation of the nucleation layer and the formation of the LNO portion are done by pulsed laser deposition, preferably without venting between the two steps. This makes it possible to avoid an exposure to air of the surface of the nucleation layer. The nucleation layer is not contaminated by water and/or hydrocarbons. The growth of the LNO portion is optimised and the overall performance is improved. According to an example, the formation of the LNO portion and the formation of the encapsulation portion are done by pulsed laser deposition successively within one same reactor without venting between said formations. This makes it possible to avoid an exposure to air of the surface of the LNO portion. The LNO portion is not contaminated by water and/or hydrocarbons. This makes it possible to avoid an intermediate surface cleaning step, to reduce the total duration of the method and to limit the costs. The overall performance is improved.

According to an example, the formation of the nucleation layer is configured such that said nucleation layer has a thickness e2 less than or equal to 200 nm, preferably less than or equal to 50 nm. This makes it possible to limit the appearance of structural defects during the formation of the nucleation layer by epitaxy.

According to an example, the formation of the LNO portion is configured such that said LNO portion has, after epitaxy, a thickness e3 of between 50 nm and 500 nm, for example, of around 200 nm. Such a thickness e3 corresponds to a thin LNO layer. Such a thickness e3 cannot be obtained with a good control of the thickness, over the entire substrate, by transfer and thinning of a layer coming from a donor substrate distinct from the receiver substrate.

According to an example, the method comprises a formation of an upper electrode on the LNO portion and a formation of a lower electrode under the LNO portion. This makes it possible, in particular, to produce "Z-cut" architecture phase modulator-type electrooptical devices.

Unless inconsistent, it is understood that all of the optional features above and/or the variants indicated can be combined so as to form an embodiment which is not necessarily illustrated or described. Such an embodiment is clearly not excluded from the invention. The features of an aspect of the invention, for example, the device or the method, can be adapted mutatis mutandis to the other aspect of the invention.

It is specified that, in the scope of the present invention, the terms "on", "surmounts", "covers", "underlying", "opposite" and their equivalents do not necessarily mean "in contact with". Thus, for example, the deposition of a first layer on a second layer, does not compulsorily mean that the two layers are directly in contact with one another, but means that the first layer at least partially covers the second layer, by being either directly in contact with it, or by being separated from it by at least one other layer or at least one other element.

A layer can moreover be composed of several sublayers of one same material or of different materials.

By a substrate, a stack, a layer "based on" a material M, or "M-based", this means a substrate, a stack, a layer comprising this material A only or this material A and optionally other materials, for example, alloy elements and/or doping elements. Thus, a silicon-based substrate means, for example, an Si or doped Si, or also SiGe substrate. An AlN-based layer means, for example, an AlN-, doped AlN-based layer, or AlN alloys, for example, AlGaN. A silicon nitride SiN-based waveguide can, for example, comprise non-stoichiometric silicon nitride (SixNy), or stoichiometric silicon nitride (Si3N4).

Several embodiments of the invention implementing successive steps of the manufacturing method are described below. Unless explicitly mentioned, the adjective "successive" does not necessarily imply, even if this is generally preferred, that the steps follow one another immediately, intermediate steps being able to separate them.

Moreover, the term "step" means the carrying out of a part of the method, and can mean a set of substeps.

Moreover, the term "step" does not compulsorily mean that the actions carried out during a step are simultaneous or immediately successive. Certain actions of a first step can, in particular, be followed by actions linked to a different step, and other actions of the first step can then be resumed. Thus, the term "step" does not necessarily mean single actions and which are inseparable over time and in the sequence of phases of the method.

A preferably orthonormal system, comprising the axes x, y, z is represented in the accompanying figures. When one single system is represented on one same set of figures, this system applies to all the figures of this set.

In the present patent application, the thickness of a layer is taken in a direction which is normal to the main extension plane of the layer. Thus, a layer typically has a thickness along z. The relative terms "on", "surmounts", "under", "underlying", "inserted", "above", "below" refer to positions taken in the direction z. This list of terms is not exhaustive. Other relative terms can be easily specified if needed, by referring to the accompanying drawings.

The terms "vertical", "vertically" refer to a direction along z. The terms "horizontal", "horizontally", "lateral", "laterally" refer to a direction in the plane xy. Unless explicitly mentioned, the thickness, the height and the depth are measured along z.

An element located "in vertical alignment with" or "to the right of" another element means that these two elements are both located on one same line perpendicular to a plane, wherein a lower or upper face of a substrate mainly extends, i.e. on one same line oriented vertically in the figures.

In the scope of the present invention, a III-N nitride is an element nitride belonging, preferably, to the column IIIa of the periodic table (three valence electrons). This column IIIa groups together earth elements such as boron, aluminium, gallium, indium. The III-N nitrides considered in the present invention are, in particular, boron nitride BN, aluminium nitride AlN, gallium nitride GaN, indium nitride InN, and their alloys, for example, and in a non-limiting manner, AlGaN, GaInN.

In the scope of the present invention, the waveguide is intended to ensure the propagation of a light wave in a main propagation direction, taken along the axis x in the accompanying drawings. The light wave is preferably coherent, monochromatic, and of wavelength λ. It preferably propagates according to one single optical propagation mode, typically the fundamental optical mode. The waveguide can thus be configured to guide the single transverse electric (TE00) or transverse magnetic (TM00) fundamental mode of the light wave. Alternatively, the guide can locally, during propagation, be configured to enable the conversion of a TM mode into a TE mode (and reciprocally). It can have several secondary modes in addition to the fundamental mode. The guide is called monomodal, if only the fundamental mode can propagate there. It is qualified as multimodal if it accepts at least two modes.

In the examples described below, the LNO portion illustrated is lithium niobate LiNbO3-based. It is understood that LiTaO3 or Li(Nb,Ta)O3 can be directly substituted for LiNbO3 in these examples. The LNO portion projects from the underlying nucleation layer. The LNO portion is presented in the form of a mesa or of a pad with respect to the nucleation layer. The LNO portion is a finite entity. This is not an abstract and arbitrary cutting of a wider layer covering, for example, the entire plate. The LNO portion is, in particular, defined by the cross-section of the opening of the masking layer.

X-ray diffraction analyses, for example in configuration 2θ, or rotating about φ and/or Ω (phi-scan and omega-scan), can be carried out so as to determine the crystalline quality of the LNO layers and of the nucleation and/or encapsulation layers, and their epitaxial relationship.

FIGS. 1 to 12 illustrate a first embodiment of an electrooptical device 1 according to the invention.

As illustrated in FIG. 1, a substrate 10 is first provided. The substrate 10 can be an SOI (silicon on insulator)-type substrate. Such a substrate 10 typically comprises, stacked along z, a support layer 11, typically a so-called silicon "bulk" substrate, an insulating layer 12, typically a so-called "BOX" buried oxide layer, and a silicon-based semi-conductive layer 13, for example, a so-called topSi silicon layer. The insulating layer 12 typically has a thickness $e_{12}$ of around 2 μm. The topSi layer 13 typically has a thickness $e_{13}$ of around 5 nm to 20 nm. Preferably, the topSi layer 13 is made of silicon oriented along (111). Other crystalline orientations are possible for the silicon layer 13, in particular (001), according to the architecture desired for the device, for example.

Figure 2:
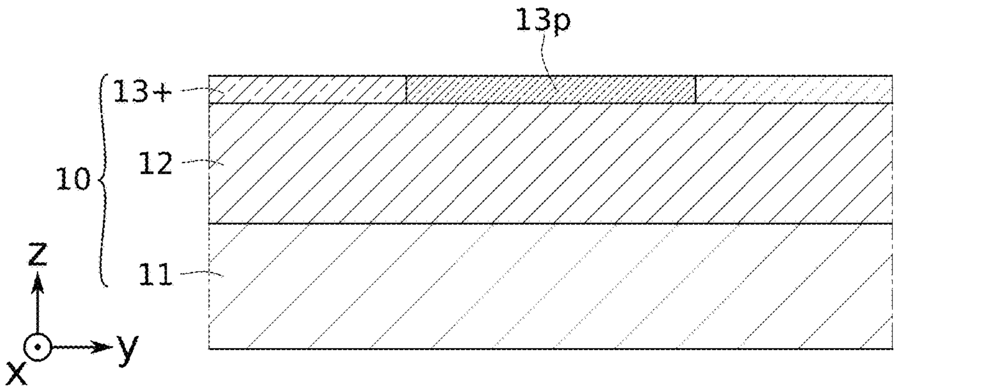

As illustrated in FIG. 2, the topSi layer 13 can be doped locally once or several times, so as to locally have a silicon portion 13*p* having a doping difference with the rest of the layer 13. According to an example, all of the layer 13 is p-doped, for example, by implantation, then the layer 13 is masked at the portion 13*p*, and a new doping by implantation is carried out. It is thus possible to obtain a p+-doped layer 13+ and a p-doped portion 13*p*. The p-doped portion 13*p* can form a lower electrode of the electrooptical device. In the scope of optical applications, for example, to form a phase modulator, it is typically preferable to resort to a p-type doping to limit the optical losses in the device. The parts of the p+-doped layer 13+ can be configured to electrically contact the portion 13*p*, for example, during a subsequent recontact.

Figure 3:
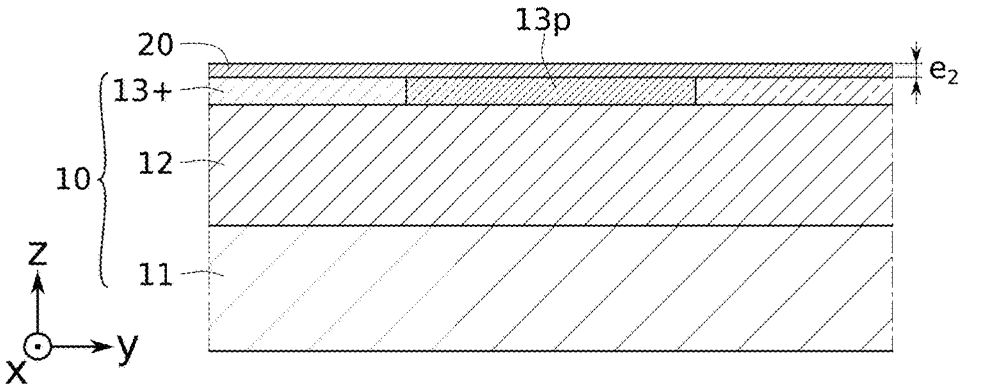

As illustrated in FIG. 3, a nucleation layer 20 is formed on the topSi layer 13 comprising the p-doped portion 13*p*. The nucleation layer 20 is preferably III-N material-based. It preferably has a hexagonal crystallographic structure. Such a III-N material structure enables, in particular, an epitaxy of the on-silicon nucleation layer 20 oriented along (001) and/or (111). This also makes it possible to subsequently epitaxially grow an LNO material in different crystalline orientations.

The nucleation layer 20 is, for example, aluminium nitride AlN-based. AlN can be deposited and/or epitaxially grown on silicon oriented along (111) and its deposition method is advantageously known and controlled. Aluminium nitride further has a mesh parameter close to that of lithium niobate. This facilitates the epitaxial growth of lithium niobate to subsequently form the LNO portion. The thermal dilatation coefficient of AlN is further located between that of LiNbO3 and that of Si. This makes it possible to limit the appearance of structural defects in the LNO portion during temperature variations linked to the different deposition steps. AlN also has a good resistance to oxidation, and a good resistance to LNO deposition methods (resistance to ionised species plasmas and to chemical precursors, making it possible to synthesise the LNO material). Boron nitride and gallium nitride have properties similar to those mentioned above for aluminium nitride. They can also be advantageously chosen for the nucleation layer 20.

The nucleation layer 20 can be formed by a physical or chemical deposition technique, for example, by pulsed laser deposition (PLD). It can be alternatively formed by one of the following techniques: chemical vapour deposition (CVD), preferably metal organic chemical vapour deposition (MOCVD), PVD sputtering, plasma-enhanced atomic layer deposition (PEALD).

The nucleation layer 20 is preferably monocrystalline. It has a preferable orientation. An orientation along a growth plane (0001) can be typically chosen for an AlN nucleation layer 20 on a silicon topSi layer 13 (111). The nucleation layer 20 is preferably stoichiometric. It has a thickness $e_2$ typically of between 5 and 20 nanometres, for example, around 10 nm.

Using a refractory nitride, in particular AlN nucleation layer 20, advantageously makes it possible to carry out a heteroepitaxy of LiNbO3 on a silicon-based substrate 10. Epitaxy in particular makes it possible to obtain a stoichiometric LiNbO3 layer, preferably oriented and of high crystalline quality. The thickness of this LiNbO3 layer obtained by epitaxy is further fully controlled. The LiNbO3 layer can be formed directly on substrates 10 of different sizes, without an intermediate transfer step. This advantageously makes it possible to decrease the manufacturing costs of an LNO/AlN/Si layer stack.

Figure 4:
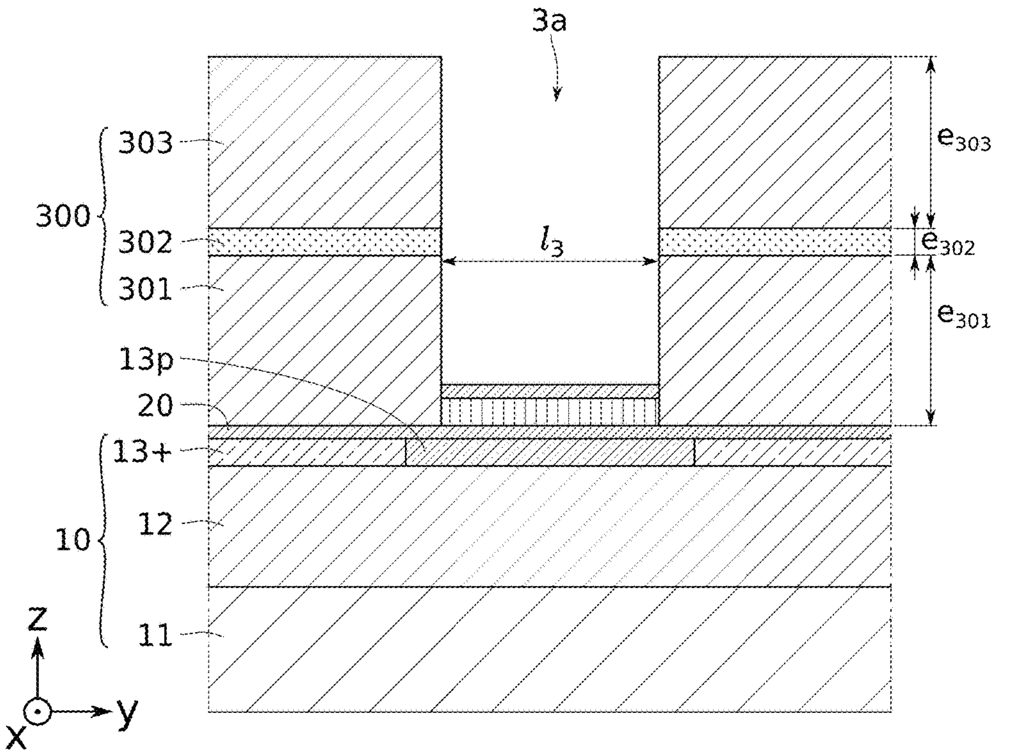

As illustrated in FIG. 4, a masking layer 300 is then formed on the nucleation layer 20, then structured. The masking layer 300 can typically comprise different layers 301, 302, 303 stacked along z, for example, a SiO2-based layer 301, a SiN-based layer 302, an SiO2-based layer 303. The SiN-based layer 302 inserted in the masking layer can typically serve as a stop layer, for example, during a subsequent chemical-mechanical polishing (CMP) step. The SiO2-based layer 301 typically has a thickness $e_{301}$ of around 100 nm to 500 nm. The SiN-based layer 302 typically has a thickness $e_{302}$ of around 5 nm to 50 nm. The SiO2-based layer 303 typically has a thickness $e_{303}$ of around 100 nm to 500 nm. The thickness $e_{303}$ of the layer 303 is preferably greater than the thickness provided for the LNO portion, for example, twice greater.

This masking layer 300 is structured, for example standardly by lithography and etching, so as to form one or more openings 3*a* opening onto the nucleation layer 20. The opening(s) 3*a* typically has/have lateral dimensions $l_3$ of several microns, for example, between 1 μm and 100 μm.

Figure 5:
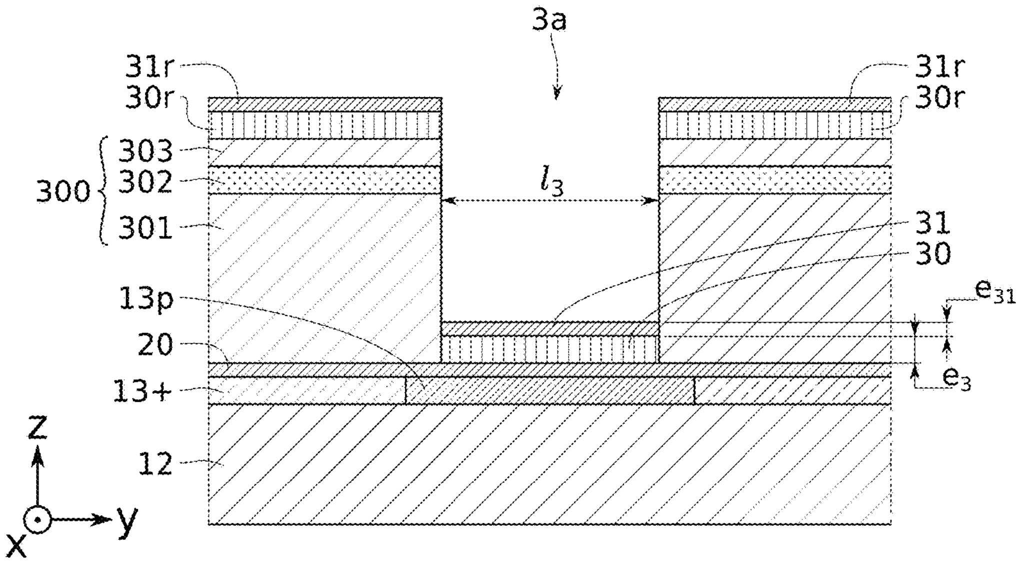

As illustrated in FIG. 5, a lithium niobate LiNbO3-based portion 30 (LNO) is then formed in the opening 3*a*, on the exposed part of the nucleation layer 20. This portion 30 LNO can be formed by a physical or chemical deposition technique, for example, by pulsed laser deposition PLD. It can be alternatively formed by one of the following techniques: chemical vapour deposition (CVD), preferably metal organic chemical vapour deposition (MOCVD), PVD sputtering, molecular beam epitaxy (MBE).

The LNO portion 30 is advantageously epitaxially grown on the nucleation layer 20. It is preferably monocrystalline. It has a preferable orientation. An orientation along a growth plane (0001) can be typically chosen. This makes it possible to maximise the Pockels effect within the LNO portion 30 with electrodes placed respectively below and above the LNO portion 30, along z. Other orientations can be chosen according to the desired device architecture and/or of the desired application.

The LNO portion 30 formed on the nucleation layer 20 is preferably stoichiometric, for example $Li_1Nb_1O_3$. The atomic percentage of lithium is ideally close to that of niobium. According to an example, the atomic percentages of lithium and of niobium are around 20%. The LNO portion 30 has a thickness $e_3$ of between 50 and 500 nanometres, for example, around 200 nm. The thickness $e_3$ of the LNO portion 30 can be chosen according to the desired application.

After formation of the LNO portion 30 in the opening 3*a*, an encapsulation portion 31, typically AlN-based, is preferably formed by epitaxy on the LNO portion 30. The portion 31 has a thickness $e_{31}$ typically of between 5 and 20 nanometres, for example, around 10 nm. The sum of the thicknesses of the portions 30, 31 is typically less than the thickness $e_{301}$ of the layer 301 underlying the layer 302. The layer 302 thus remains above the portions 30, 31 along z. This makes it possible to use the layer 302 as a layer for detecting the end of polishing during the subsequent CMP polishing.

According to an option, the encapsulation portion 31 and the LNO portion 31 are both produced in situ by PLD in one same growth reactor. The growth of the encapsulation portion 31 can thus be produced directly after the end of growth of the LNO portion 30. This makes it possible to avoid a venting of the LNO portion 30 before epitaxy of the encapsulation portion 31. The surface of the LNO portion 30 therefore remains clean. This avoids an intermediate cleaning step. The duration of the method is thus decreased. This also makes it possible to limit the appearance of roughness during the formation of the encapsulation portion 31. The surface state of the latter is thus optimised.

Growth residues 30*r*, 31*r* can be deposited at the periphery of the opening 3, on the masking layer 300, during the epitaxy of the portions 30, 31 in the opening 3*a*.

Figure 6:
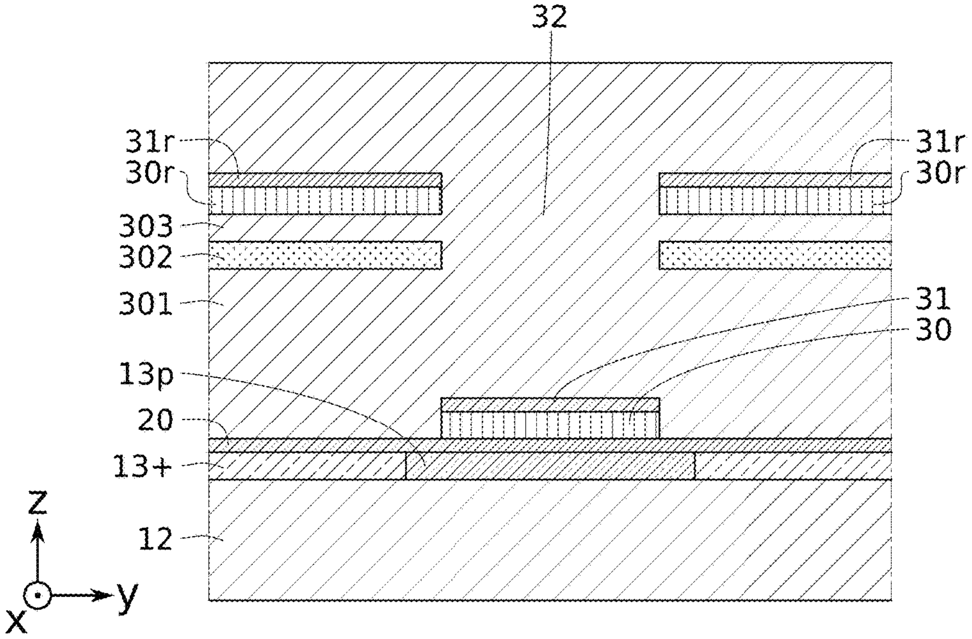

As illustrated in FIG. 6, the opening 3 can then be filled by a dielectric filling material 32, typically by SiO2. This makes it possible to planarise the structure.

Figure 7:
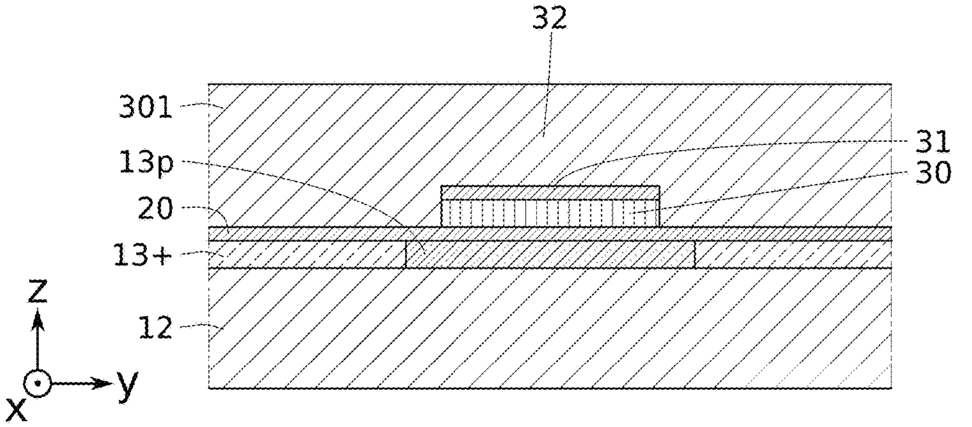

As illustrated in FIG. 7, after filling, a chemical-mechanical polishing CMP is carried out so as to remove the growth residues 30*r*, 31*r*. The SiN-based layer 302 is advantageously used as a stop layer or as a layer for detecting the end of polishing. The polishing is typically stopped in the layer 301, just after the layer 302 has been removed. After CMP, the portions 30, 31 subsist, bordered by a layer part 301, and surmounted by a material filling part 32.

Figure 8:
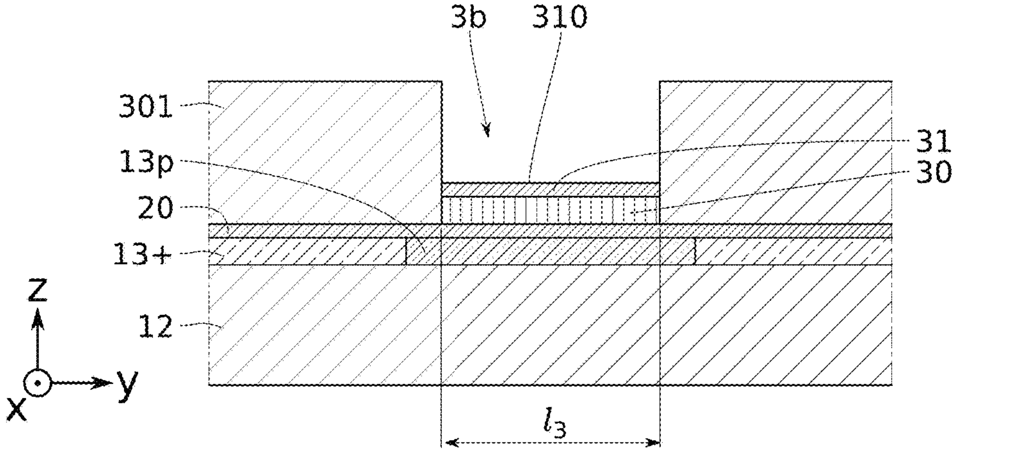

As illustrated in FIG. 8, after polishing, a new opening 3*b* is made above the portions 30, 31, so as to expose the surface 310 of the encapsulation portion 31. This new opening 3*b* typically has lateral dimensions $l_3$ less than or substantially equal to those of the opening 3*a*. The new opening 3*b* is typically centred on the portions 30, 31. The opening 3*b* can be made standardly by lithography and etching.

Figure 9:
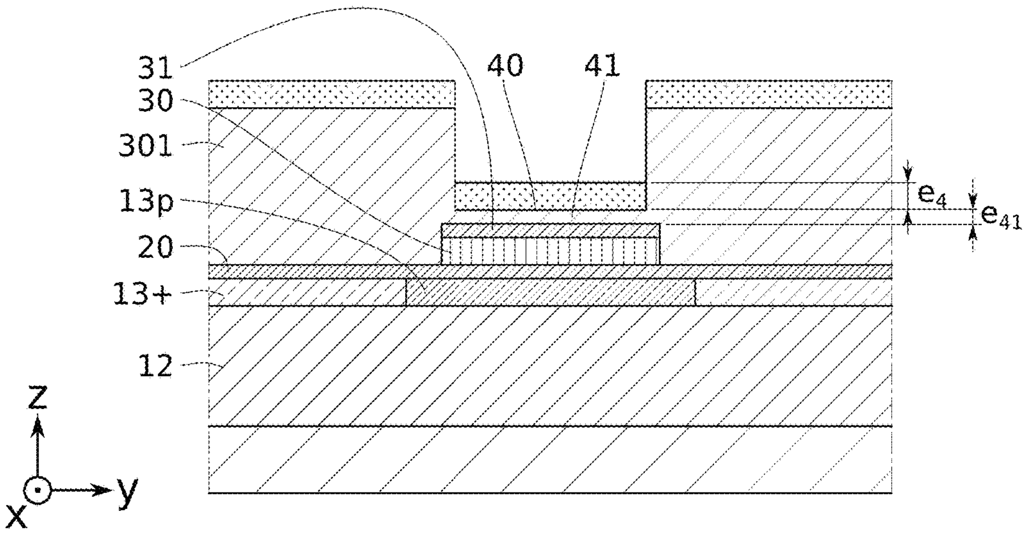

As illustrated in FIG. 9, according to a preferred option, an SiO2-based spacer layer 41, then a layer 40 are then formed on the encapsulation portion 31. The layer 40 is, in this case, intended to be structured in the form of a waveguide pattern to guide a light propagation in the device along x. The layer 40 typically has a thickness $e_4$ of around 100 nm to 800 nm, according to the targeted applications, for example, according to the wavelength of the light to be guided, and to the material used. The layer 40 can be SiN-, TiO2-, ZrO2-, Ta2O5-based, for example. Alternatively, this layer 40 can be amorphous silicon Si-a-based. The spacer layer 41 can be deposited conformally in the opening 3*b*. It typically has a thickness $e_{41}$ of around 200 nm. This spacer layer 41 makes it possible to control the optical coupling between the waveguide pattern and the LNO portion. This makes it possible, in particular, to limit the optical coupling losses during the passage between zones only comprising waveguide patterns, without LNO portion, and hybrid zones, comprising both LNO portions and waveguide patterns.

Figure 10:
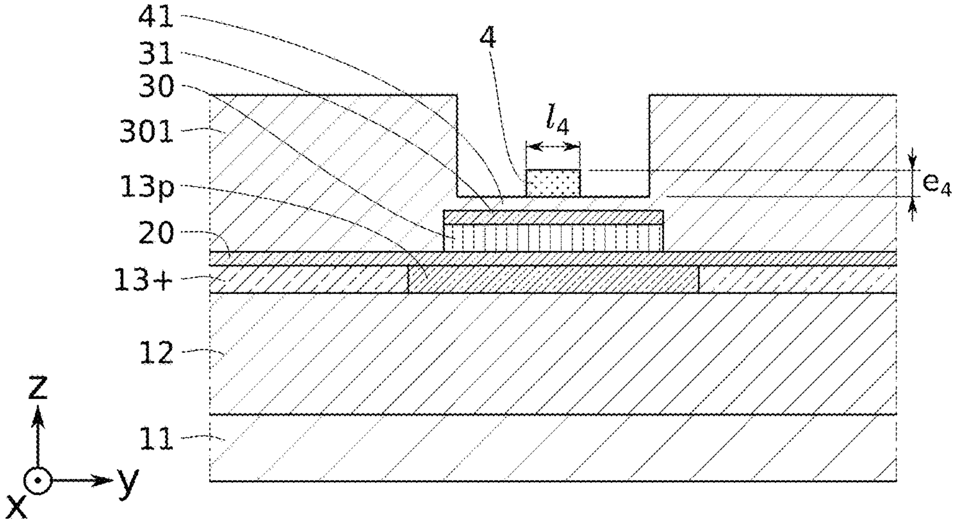

As illustrated in FIG. 10, the layer 40 is structured standardly by lithography and etching to form a waveguide pattern 4. The waveguide pattern 4 typically has a lateral dimension $l_4$ along y of between 200 nm and 2000 nm, and a height $e_4$ along z of between 100 nm and 800 nm. The waveguide pattern 4 is configured to guide a propagation of light in the device along x in the example illustrated. The propagation can be done also along y, or more generally, in the plane xy according to the design of the waveguide pattern 4 in the case where the orientation of the LNO portion is Z-cut. The waveguide pattern 4 can form an edge waveguide with the underlying LNO portion 30. This typically makes it possible to guide the propagation of a TM optical mode in a phase modulation device based on a Z-cut LNO portion.

Figure 11:
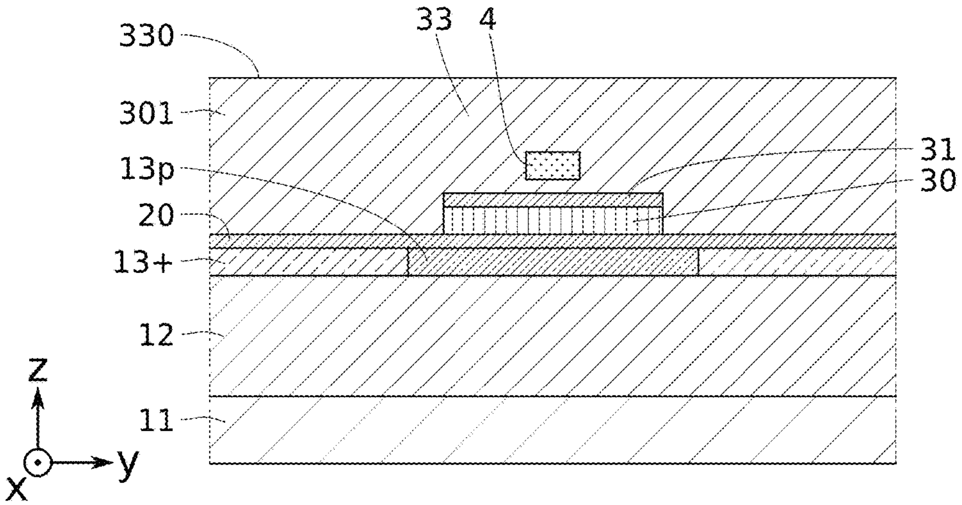

As illustrated in FIG. 11, after production of the waveguide pattern 4, an encapsulation by a dielectric material 33, typically SiO2, is done on and around the waveguide pattern 4. A CMP planarisation step can be carried out after filling by the dielectric material 33, so as to obtain a flat surface 330.

Figure 12:
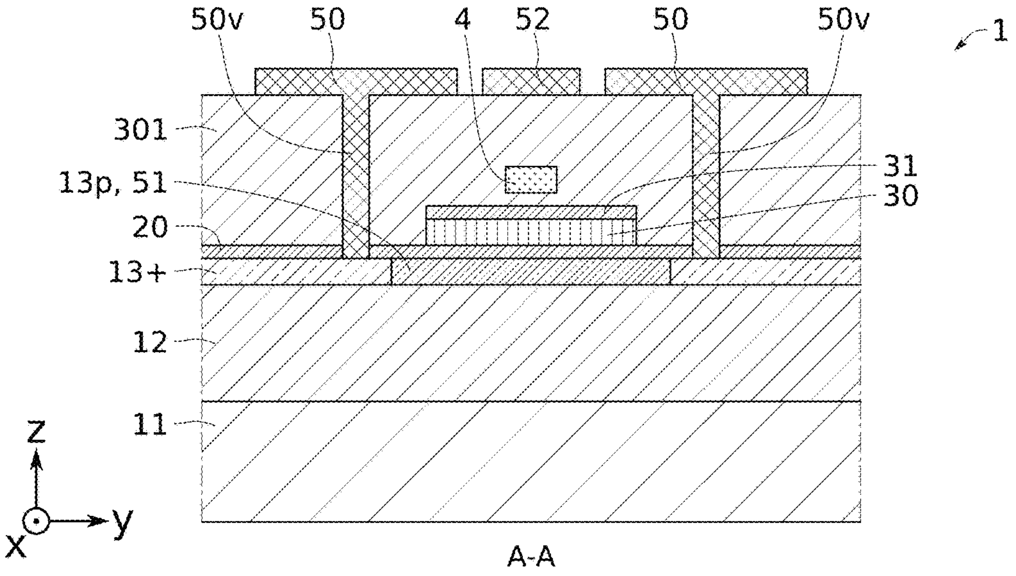

As illustrated in FIG. 12, after planarisation, interconnections 50*v* in the form of through vias can be carried out to electrically connect the p-doped silicon portion 13*p*, which forms a lower electrode 51 of the device 1. These interconnections 50*v* typically pass through the layer 301 and the nucleation layer 20 and have an end in contact with the p+-doped topSi layer 13+. A contact level on the front face of the device 1 can then be produced. This level typically comprises the contacts 50 connected to the through vias 50*v*, and an upper electrode 52 disposed above the LNO portion 30. An electrooptical device 1 is thus formed. Advantageously, this device 1 comprises an LNO portion 30 oriented (0001) on an oriented silicon substrate (111). The LNO portion 30 is typically inserted between two layers AlN 20, 31 (0001). The device 1 further comprises a lower electrode 51 located under the LNO portion 30 and an upper electrode 52 located above the LNO portion 30. According to an option, the device 1 comprises an edge waveguide pattern 4 surmounting the LNO portion 30. This electrooptical device 1 advantageously makes it possible to modulate the phase of a light wave propagating along x in the waveguide formed by the LNO portion 30 and the edge waveguide pattern 4, by Pockels effect, by applying an electric field between the lower and upper electrodes 51, 52.

Figure 13:
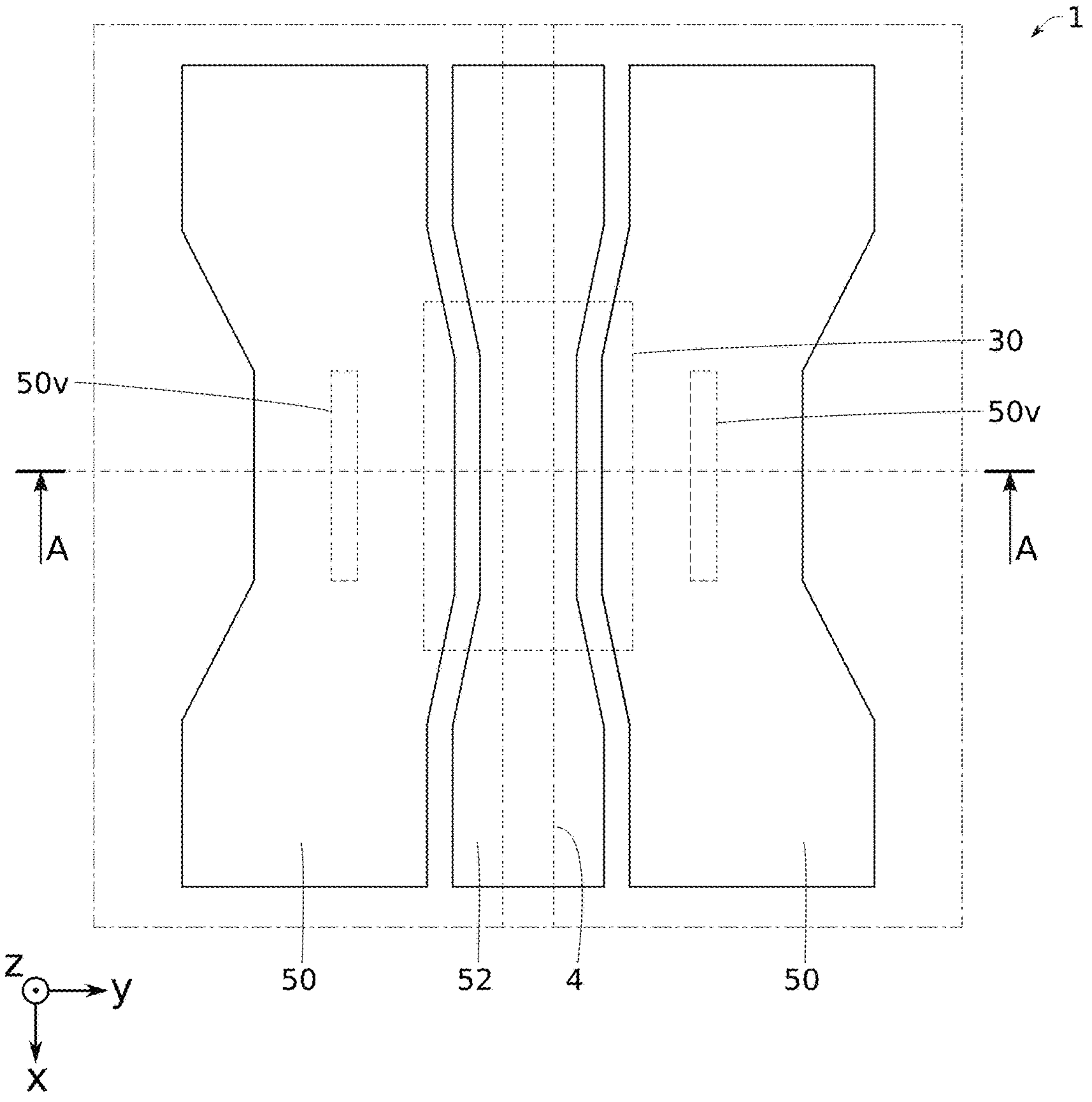
FIG. 13 illustrates, as a top view, the device according to the embodiment illustrated in FIG. 12.

FIG. 13 illustrates, as a top view, the electrooptical device 1. The cross-sectional plane A-A corresponds to the transverse view illustrated in FIG. 12. The design of the coplanar contacts 50 and electrode 52 can be produced so as to minimise the optical propagation losses, according to the rules known to a person skilled in the art.

Figure 14:
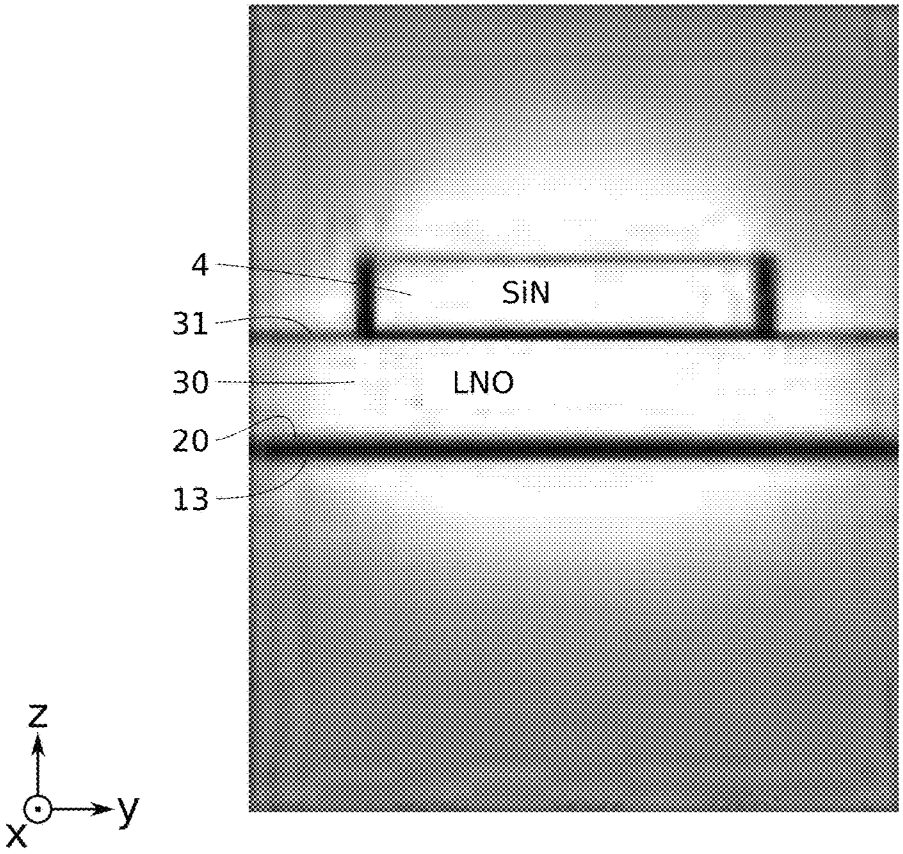
FIG. 14 illustrates, as a cross-section, a simulated distribution of the light intensity propagating in a device according to an embodiment of the present invention.

FIG. 14 has a simulation result illustrating the distribution of the light wave within the waveguide formed by the LNO portion 30 and the edge waveguide 4, in the device 1. The light wave, in this case, has a wavelength $\lambda$=1.55 μm. The topSi layer 13 has a thickness $e_{13}$=20 nm. The AlN nucleation layer 20 has a thickness $e_2$=20 nm. The LNO portion 30 has a thickness $e_3$=300 nm. The AlN encapsulation layer 40 has a thickness $e_4$=20 nm. The waveguide pattern 4 has a height $e_4$=200 nm, and a width 14=1200 nm. The actual refraction index of the waveguide thus formed is 2.35. The coverage of the light wave on the LNO portion is, in this case, 50%. The modulation of the refraction index of the LNO portion 30 by Pockels effect in this device therefore effectively makes it possible to modulate the phase of the light wave. An optical phase modulator comprising an on-silicon LNO portion is thus advantageously produced. This phase modulator can be integrated in an on-silicon Mach-Zehnder architecture.

Figure 15:
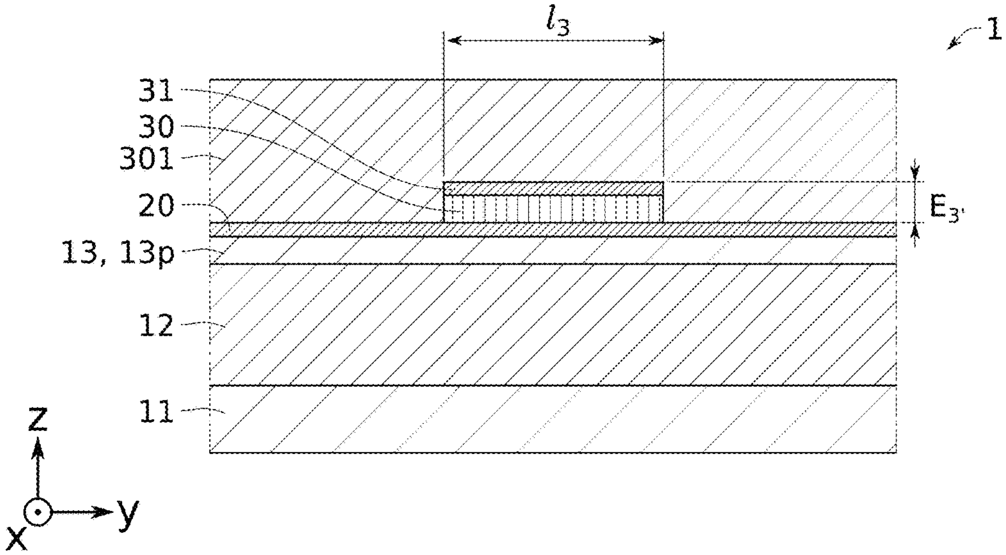
FIG. 15 illustrates, as a cross-section, a variant of the device according to an embodiment of the present invention.

FIG. 15 illustrates an electrooptical device 1 variant, wherein the waveguide is totally formed by the LNO portion 30 inserted between the encapsulation portion 31 and the nucleation layer 20, without other projecting waveguide. This type of waveguide typically has a height $e_3$, of between 100 and 500 nanometres, and a width $l_3$ along y of between 500 and 2000 nanometres. This type of waveguide requires less manufacturing steps and is cheaper to produce.

Figure 16:
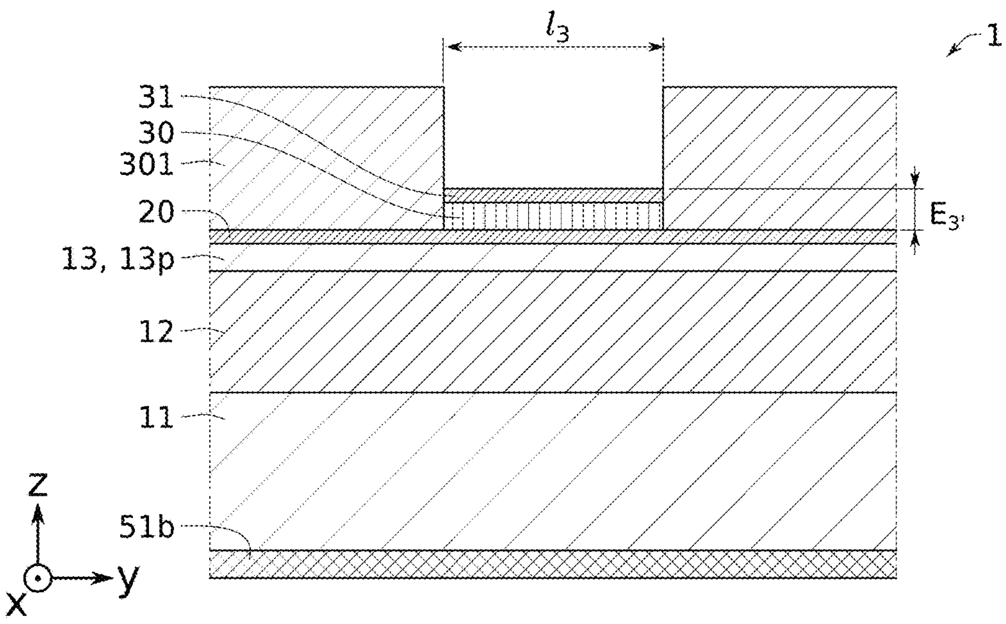
FIG. 16 illustrates, as a cross-section, another variant of the device according to an embodiment of the present invention.

FIG. 16 illustrates another variant of the electrooptical device 1, wherein the lower electrode 51*b* is formed on the rear face of the device, under the doped silicon-based support layer 11. The topSi layer 13 is, in this case, non-doped. This reduces the optical losses of the device 1.

Other applications can also be considered. The localised on-silicon LNO epitaxy can be advantageously implemented to cointegrate different devices having different functions.

Figure 17:
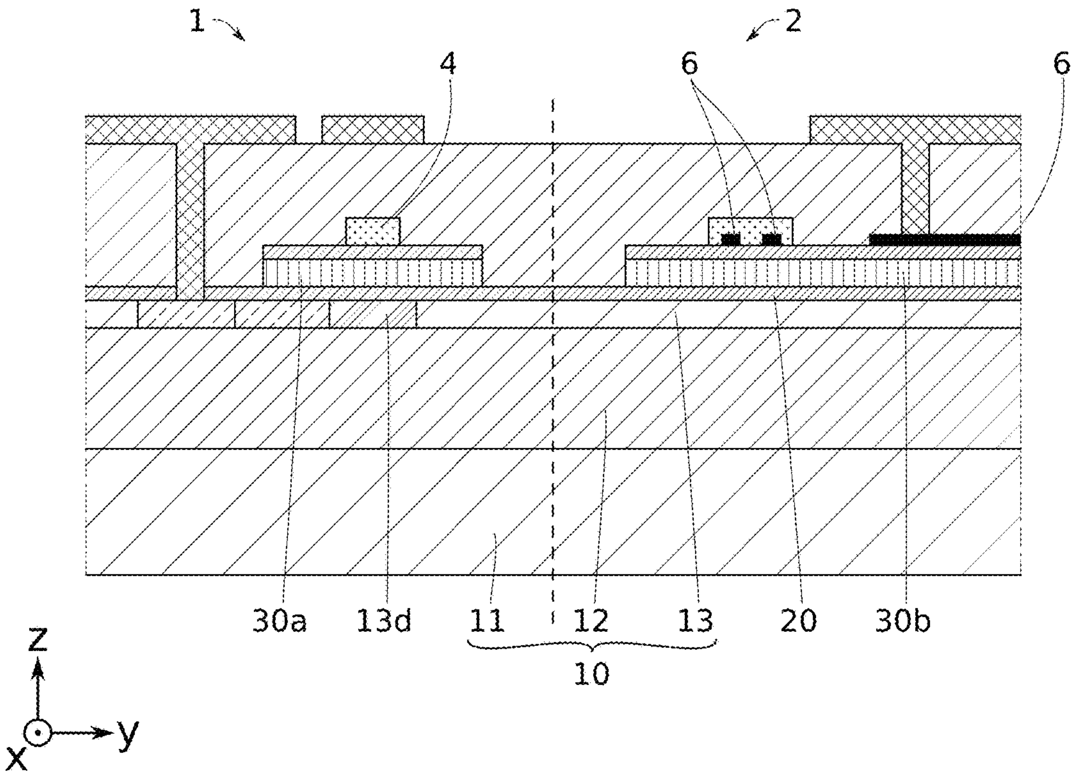
FIG. 17 illustrates, as a cross-section, a system comprising a cointegrated electrooptical device and quantum device, according to an embodiment of the present invention.

FIG. 17 illustrates a system according to the invention comprising an electrooptical device 1 such as described above, and a niobium nitride NbN-based superconductor detector 2, on one same silicon-based substrate 10. Thus, it is possible to provide, in a second opening of the masking layer, a formation by epitaxy of a second LNO portion 30*b*, then an epitaxy of NbN structures 6 on LNO or NbN/AlN/LNO. This makes it possible to consider the cointegration of different devices 1, 2, partially formed by the same growths localised in different openings. The LNO portions advantageously make it possible to epitaxially grow transition metal nitride-based superconductor materials, such as NbN or TiN, or NbTiN or others. The LNO portions typically form a nucleation layer for these superconductor materials. Their mesh parameters are close and their thermal dilation coefficient difference is low. The formations of the different layers and portions can advantageously be done successively by epitaxy. The overall cost of the method for manufacturing a system comprising an electrooptical device 1 and a superconductor detector 2 is decreased.

From the above, it clearly appears that the present invention advantageously makes it possible to form localised portions of thin LNO layers of good crystalline quality on silicon-based substrates comprising a nucleation layer made of a nitride-based refractory material, typically III-N-material-based. These localised LNO portions are advantageously directly integrable in electrooptical or quantum devices. Other applications can be considered. The invention is not limited to the embodiments described above.

The invention claimed is:

1. A device comprising, stacked along a so-called vertical direction (z), a silicon-based substrate, a nucleation layer on said substrate, the nucleation layer being made of a nitride-based refractory material, a lithium niobate- or lithium tantalate-based layer portion, called LNO portion, said LNO portion being bordered by a masking layer and epitaxially grown as a mesa on an exposed portion of the nucleation layer through an opening in the masking layer, said device further comprising two electrodes configured to apply an electric field to the LNO portion.

2. The device according to claim 1, wherein the nitride-based refractory material is taken from among III-N refractory nitrides based on an element of the III group, such as gallium nitride GaN, aluminium nitride AlN, and AlGaN alloy.

3. The device according to claim 1, wherein the substrate is silicon-based oriented in an orientation, the nucleation layer is aluminium nitride AlN-based oriented in an orientation, and the LNO portion is oriented in the orientation.

4. The device according to any one of the preceding claim 1, wherein the LNO portion is surmounted by an aluminium-based encapsulation portion, for example, aluminium nitride AlN-based or sapphire Al2O3-based.

5. The device according to claim 1, wherein an upper electrode from among the two electrodes is disposed above the LNO portion and a lower electrode from among the two electrodes is disposed below the LNO portion.

6. The device according to claim 1, configured to form an electrooptical device such as an optical phase modulator.

7. A system comprising, on one same silicon-based substrate, at least one electrooptical device according to claim 6, and a superconductor detector.

8. The device according to claim 1, wherein the LNO portion is surmounted by a waveguide pattern configured to form an edge waveguide with the LNO portion.

9. The device according to claim 1, wherein the LNO portion is surmounted by structures made of a transition metal nitride-based superconductor material, the device forming a superconductor detector.

10. A method for producing a device, the method comprising:

providing a silicon-based substrate, forming a nucleation layer made of a nitride-based refractory material on the substrate, forming a masking layer on the nucleation layer, comprising at least one opening exposing a part of the nucleation layer, forming, by epitaxy, a lithium niobate- or lithium tantalate-based layer portion, called LNO portion, in mesa on the exposed part of the nucleation layer, in the at least one opening, and forming two electrodes configured to apply an electric field to the LNO portion.

11. The method according to claim 10, further comprising, after epitaxy of the LNO portion, an at least partial removal of the masking layer by preserving the LNO portion formed locally in the at least one opening.

12. The method according to claim 11, wherein the removal is done by chemical-mechanical polishing.

13. The method according to claim 10, further comprising, after epitaxy of the LNO portion, a formation by epitaxy, on the LNO portion, of an aluminium-based encapsulation portion, for example aluminium nitride AlN-based or sapphire Al2O3-based.

14. The method according to claim 10, further comprising, after epitaxy of the LNO portion, a formation of a silicon nitride SiN-based waveguide pattern configured to form a ridge waveguide with the LNO portion.

15. The method according to claim 10, wherein the formation of the nucleation layer and the formation of the LNO portion are done by pulsed laser deposition.

* * * * *